(12) United States Patent
Hwang

(10) Patent No.: US 9,196,621 B2
(45) Date of Patent: Nov. 24, 2015

(54) SEMICONDUCTOR DEVICE

(71) Applicant: SK hynix Inc., Gyeonggi-do (KR)

(72) Inventor: Sun-Ha Hwang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 5 days.

(21) Appl. No.: 14/141,229

(22) Filed: Dec. 26, 2013

(65) Prior Publication Data

US 2015/0102415 A1 Apr. 16, 2015

(30) Foreign Application Priority Data

Oct. 15, 2013 (KR) .................. 10-2013-0122587

(51) Int. Cl.
| | |
|---|---|
| *H01L 27/088* | (2006.01) |
| *H01L 27/11* | (2006.01) |
| *H01L 27/092* | (2006.01) |
| *G11C 11/41* | (2006.01) |
| *G11C 11/40* | (2006.01) |
| *G11C 11/412* | (2006.01) |
| *H01L 27/02* | (2006.01) |

(52) U.S. Cl.
CPC .......... *H01L 27/1104* (2013.01); *G11C 11/40* (2013.01); *G11C 11/41* (2013.01); *G11C 11/412* (2013.01); *H01L 27/0207* (2013.01); *H01L 27/092* (2013.01); *H01L 27/11* (2013.01)

(58) Field of Classification Search
None
See application file for complete search history.

(56) References Cited

U.S. PATENT DOCUMENTS

| | | | |
|---|---|---|---|
| 2003/0006433 A1* | 1/2003 | Funayama et al. | ............ 257/202 |
| 2012/0086082 A1 | 4/2012 | Malinge et al. | |
| 2012/0108036 A1 | 5/2012 | Chang et al. | |

* cited by examiner

*Primary Examiner* — Fei Fei Yeung Lopez
(74) *Attorney, Agent, or Firm* — IP & T Group LLP

(57) ABSTRACT

A semiconductor device includes a first and a second active regions having a first conductive type and a second conductive type, respectively, being arranged in a first direction; a gate extending in the first direction; a first and a second channel regions defined under the gate in the first and the active regions, respectively; a first low-concentration doped region, having the second conductive type, formed at sides of the gate in the first active region and a first high-concentration doped region, having the second conductive type, formed at sides of the first low-concentration doped region in the first active region; and a second low-concentration doped region, having the first conductive type, formed at sides of the gate in the second active region and a second high-concentration doped region, having the first conductive type, formed at sides of the second low-concentration doped region in the second active region.

18 Claims, 6 Drawing Sheets

SEMICONDUCTOR DEVICE

CROSS-REFERENCE TO RELATED APPLICATIONS

The present application claims priority of Korean Patent Application No. 10-2013-0122587 filed on Oct. 15, 2013, which is incorporated herein by reference in its entirety.

BACKGROUND

1. Field

Exemplary embodiments of the present invention relate to a semiconductor device, and more particularly, to a semiconductor device including an NMOS transistor and a PMOS transistor, such as an SRAM (Static Random Access Memory) cell.

2. Description of the Related Art

Semiconductor memory cells may be divided in nonvolatile memory cells and volatile memory cells. The nonvolatile memory cell has a characteristic of maintaining data stored therein even though power supply is cut off, and may include a flash memory cell a phase change memory cell, a magnetic memory cell and the like. On the other hand, the volatile memory cell has a characteristic of losing data stored therein when power supply is cut off, and may include a DRAM (Dynamic Random Access Memory) cell, an SRAM cell and the like.

In particular, the SRAM cell has higher operating speed than the DRAM cell, and does not require a refresh operation. However, the SRAM cell occupies a larger area than the DRAM cells. For this reason much research has been conducted on a method capable of reducing the size of the SRAM cell while securing the performance of the SRAM cell.

SUMMARY

Various exemplary embodiments are directed to a semiconductor device capable of reducing a size while securing performance.

In an exemplary embodiment, a semiconductor device may include: a first active region having a first conductive type and a second active region having a second conductive type, the first active region and the second active region being arranged in a first direction in a semiconductor substrate; a gate extending in the first direction and crossing the first active region and the second active region; a first channel region defined under the gate in the first active region and a second channel region defined under the gate in the second active region; a first low-concentration doped region, having the second conductive type, formed at both sides of the gate in the first active region and a first high-concentration doped region, having the second conductive type, formed at both sides of the first low-concentration doped region in the first active region; and a second low-concentration doped region, having the first conductive type, formed at both sides of the gate in the second active region and a second high-concentration doped region, having the first conductive type, formed at both sides of the second low-concentration doped region in the second active region, and wherein the second channel region protrudes toward the first active region in the first direction, compared to the second high-concentration doped region.

In an exemplary embodiment, a semiconductor device may include: a first active region having a first conductive type and a second active region having a second conductive type, the first active region and the second active region being arranged in a first direction in a semiconductor substrate; a gate extending in the first direction and crossing the first active region and the second active region; and a gate spacer formed on a sidewall of the gate, wherein a first portion of the second active region, which overlaps the gate, protrudes toward the first active region in the first direction, compared to a second portion of the second active region, the second portion does not overlap the gate and the gate spacer.

In an exemplary embodiment, a semiconductor device may include: an NMOS active region and a PMOS active region arranged in a first direction; a shared gate extending in the first direction and crossing the NMOS active region and the PMOS active region; a pass gate separated from the shared gate in a second direction, the pass gate extending in the first direction to cross the NMOS active region; a first NMOS channel region defined in the NMOS active region under the shared gate and a PMOS channel region defined in the PMOS active region under the shared gate; a second NMOS channel region defined under the pass gate in the NMOS active region; a first low-concentration N-type region and a first high-concentration N-type region defined in the NMOS active region at both sides of the shared gate and being sequentially arranged from the first NMOS channel region; a second low-concentration N-type region and a second high-concentration N-type region defined in the NMOS active region at both sides of the pass gate and being sequentially arranged from the second NMOS channel region; and a low-concentration P-type region and a high-concentration P-type region defined in the PMOS active region at both sides of the shared gate and being sequentially arranged from the PMOS channel region, wherein the first. NMOS channel region protrudes toward the PMOS active region in the first direction, compared to the first high-concentration N-type region.

BRIEF DESCRIPTION OF THE DRAWINGS

Each of FIG. 2

DETAILED DESCRIPTION

Figure 1:
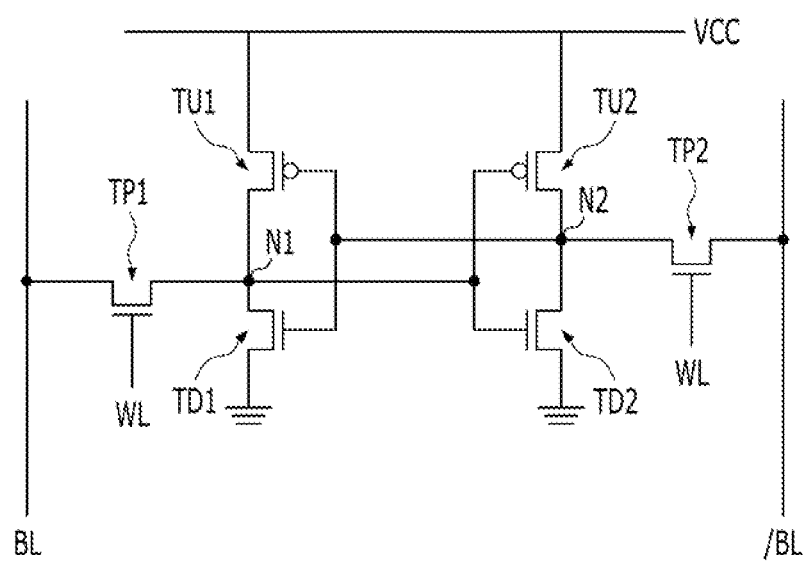
FIG. 1 is a circuit diagram of an SRAM cell in accordance with an exemplary embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention.

The drawings are not necessarily to scale and in some instances proportions may have been exaggerated in order to clearly illustrate features of the embodiments. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

It is also noted that in this specification, "connected/connected" refers to one component not only directly coupling another component but also indirectly coupling another component through an intermediate component. In addition, a singular form may include a plural form as long as it is not specifically mentioned in a sentence.

FIG. 1 is a circuit diagram of an SRAM cell in accordance with an exemplary embodiment of the present invention.

Referring to FIG. 1, the SRAM cell in accordance with the exemplary embodiment of the present invention may include a first pass transistor TP1, a second pass transistor TP2, a first pull-up transistor TU1 a second pull-up transistor TU2, a first pull-down trans star TD1, and a second pull-down transistor TD2. The first and second pull-up transistors TU1 and TU2 may include PMOS transistors, and the first and second pass transistors TP1 and TP2 and the first and second pull-down transistors TD1 and TD2 may include NMOS transistors.

The first pull-up transistor TU1 and the first pull-down transistor TD1 may form a first inverter, and the second pull-up transistor TU2 and the second pull-down transistor TD2 may form a second inverter. Specifically, the drain of the first pull-up transistor TU1 and the drain of the first pull-down transistor TD1 may be connected to a first node N1, and the gate of the first pull-up transistor TU1 may be electrically connected to the gate of the first pull-down transistor TD1. The source of the first pull-up transistor TU1 may be connected to a power supply voltage line VCC, and the source of the first pull-down transistor TD1 may be connected to a ground line. Similarly, the drain of the second pull-up transistor TU2 and the drain of the second pull-down transistor TD2 may be connected to a second node N2, and the gate of the second pull-up transistor TU2 may be electrically connected to the gate of the second pull-down transistor TD2. The source of the second pull-up transistor TU2 may be connected to the power supply voltage line VCC, and the source of the second pull-down transistor TD2 may be connected to the ground line.

The gates of the first pull-up and pull-down transistors TU1 and TD1, which are connected to each other, may correspond to an input terminal of the first inverter, and the first node N1 may correspond to an output terminal of the first inverter. Furthermore, the gates of the second pull-up and pull-down transistors TU2 and TD2, which are connected to each other, may correspond to an input terminal of the second inverter, and the second node N2 may correspond to an output terminal of the second inverter. The first and second inverters may be connected to each other in a latch structure. That is, the gates of the first pull-up and pull-down transistors TU1 and TD1 may be connected to the second node N2, and the gates of the second pull-up and pull-down transistors TU2 and TD2 may be connected to the first node N1.

The source of the first pass transistor TP1 may be connected to the first node N1, and the drain of the first pass transistor TP1 may be connected to a bit line BL. The source of the second pass transistor TP2 may be connected to the second node N2, and the drain of the second pass transistor TP2 may be connected to a bit line bar/BL. The gates of the first and second pass transistors TP1 and TP2 may be connected to corresponding word lines WL, respectively.

Figure 2:
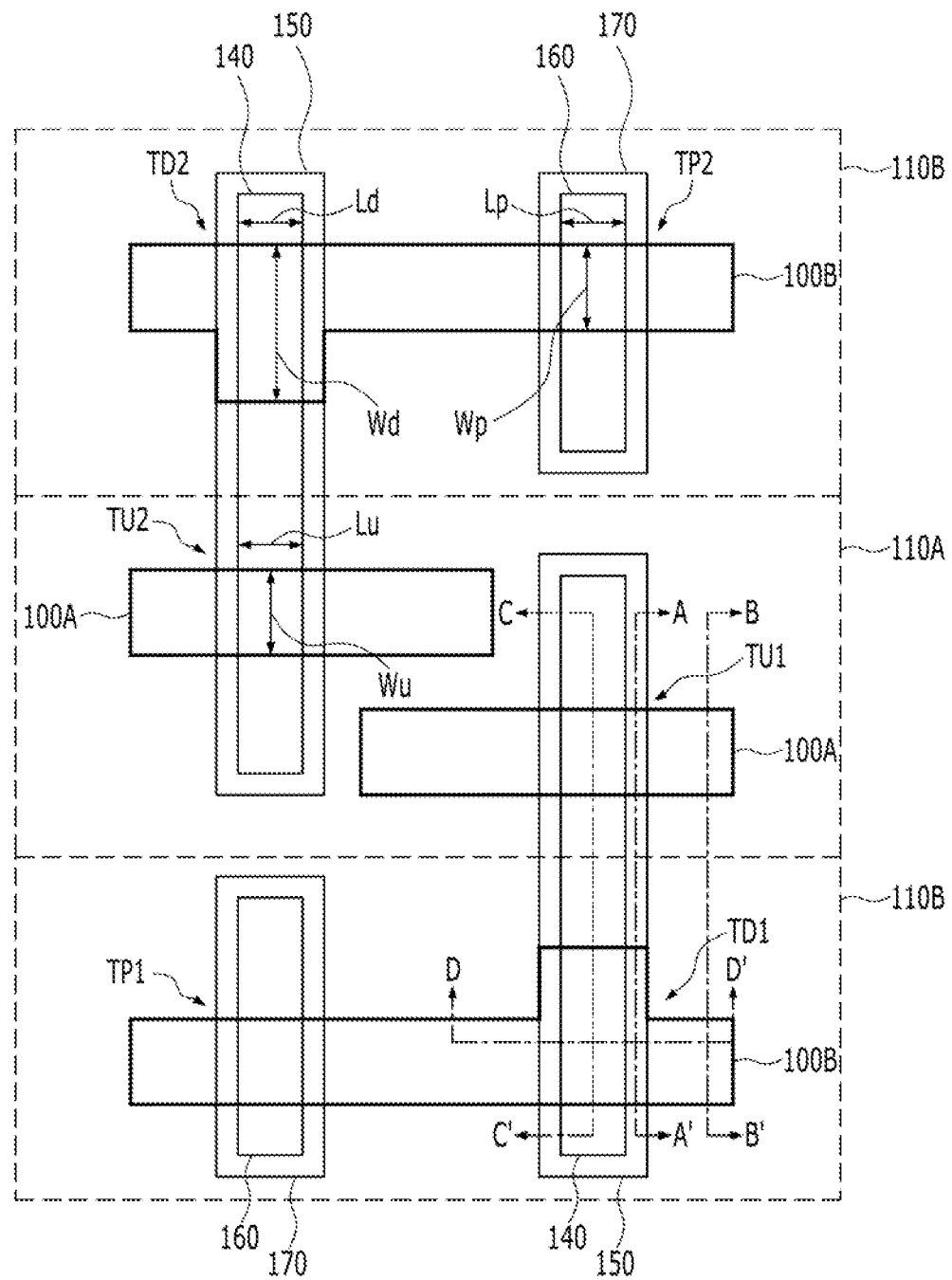
Figure 3A:
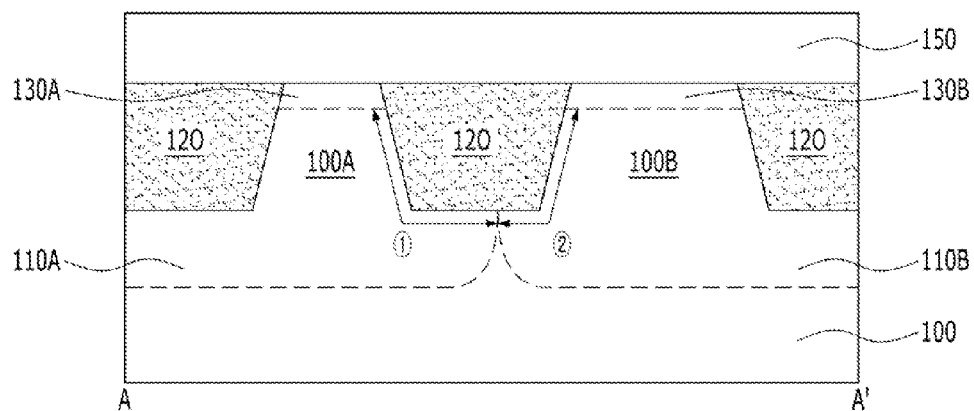
FIG. 3A is a cross-sectional view taken along line A-A' of FIG. 2.
Figure 3B:
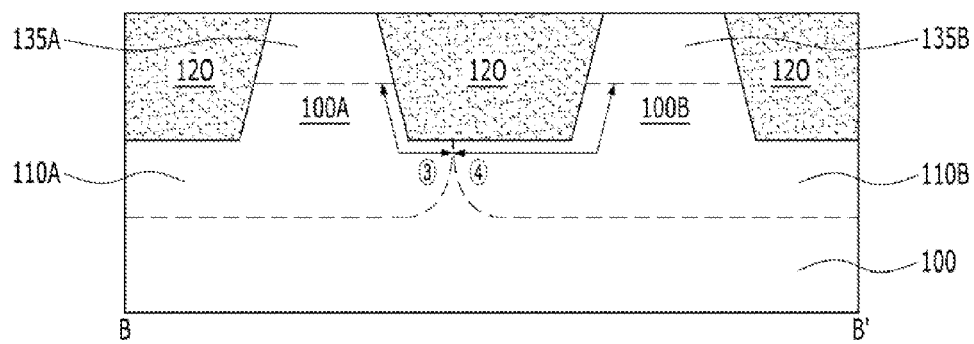
FIG. 3B is a cross-sectional view taken along line B-B' of FIG. 2.
Figure 3C:
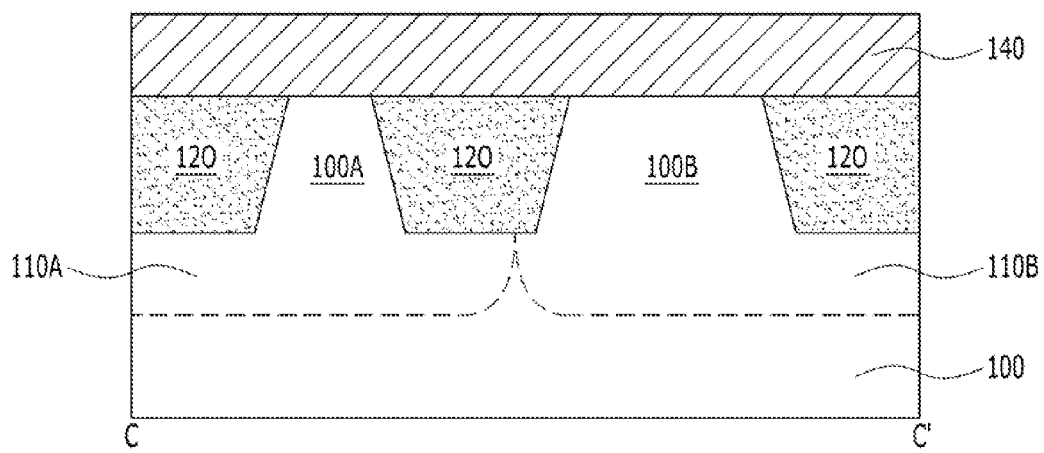
FIG. 3C is a cross-sectional view taken along line C-C' of FIG. 2.

FIGS. 2 to 3C only illustrate the transistor part of the SRAM cell.

FIG. 2 is a plan view of an active region and a gate of the SRAM cell of FIG. 1. FIG. 3A is a cross-sectional view taken along line A-A' of FIG. 2. FIG. 3B is a cross-sectional view taken along line B-B' of FIG. 2. FIG. 3C is a cross-sectional view taken along line C-C' of FIG. 2.

Referring to FIGS. 2 to 3C, the SRAM cell in accordance with an exemplary embodiment of the present invention may include first and second active regions 100A and 100B that are defined in a semiconductor substrate 100 by an isolation layer 120 and arranged in a first direction and separated from each other.

The first active region 100A is an active region for the first and second pull-up transistors TU1 and TU2, and may include a PMOS active region forming a PMOS transistor. The second active region 100B is an active region for the first and second pull-down transistor TD1 and TD2 and the first and second pass transistors TP1 and PT2, and may include an NMOS active region forming an NMOS transistor. In the present exemplary implementation, two first active regions 100A and two second active regions 100B may be arranged in the first direction, and the two first active regions 100A may be disposed between the two second active regions 100B while adjacent to each other.

The first and second active regions 100A and 100B maybe formed in a shape that has a minor axis in the first direction and a major axis in a second direction crossing the first direction substantially perpendicular to the first direction. Furthermore, the second active region 100B may be formed in a shape having a portion that protrudes toward the first active region 100A in the first direction.

The first active region 100A may be formed in a first well 110A formed in the semiconductor substrate 100. The first well 110A may have a first conductive type. For example, if the first active region 100A is a PMOS active region, then the first conductive type may be an N-type. The second active region 100B may be formed in a second well 110B formed in the semiconductor substrate 100. The second well 110B may have a second conductive type different from the first conductive type. For example, if the second active region 100B is an NMOS active region, then the second conductive type may be set to a P-type. In the exemplary embodiment, since the two first active regions 100A are adjacent to each other the two first active regions 100A may be formed in one first well 110A. On the other hand, since the two second active regions 100B are separated from each other, each of the two second active regions 100B may be formed in a corresponding second well 110b. In other words, the second well 110B, the first well 110A, and the second well 110B may be sequentially arranged in the first direction, and the second active region 100B, the two first active regions 100A, and the second active region 100B may be defined in the second well 110B, the first well 110A, and the second well 110B, respectively.

A shared gate 140 and a pass gate 160 may be formed over the semiconductor substrate 100. The shared gate 140 crosses the first active region 100A and the second active region 100B that are adjacent to each other, and the pass gate 160 crosses only the second active region 100B. In the exemplary embodiment, the shared gate 140 crossing the first active region 100A and the second active region 100B at a first portion of the semiconductor substrate, the shared gate 140 crossing the first active region 100B and the second active region 100B at a second portion of the semiconductor substrate, and the two pass gates 160 crossing the two second active regions 100B, respectively, may be formed. The shared gate 140 and the pass gate 160 may be separated from each other. For this structure, the shared gate 140 and the pass gate 160, which cross the same second active region 100B, may be separated from each other in the second direction.

A shared gate spacer 150 may be formed on a sidewall of the shared gate 140 and a pass gate spacer 170 may be formed on a sidewall of the pass gate 160. Although not illustrated, a gate dielectric layer may be disposed between the semiconductor substrate 100 and the shared gate 140 and between the semiconductor substrate 100 and the pass gate 160.

At this time, the second active region 100B may be formed in such a shape that a portion thereof overlapping the shared gate 140 and the shared gate spacer 150 protrudes toward the adjacent first active region 100A, compared to the other portion thereof. Thus, the portion of the second active region 100B, overlapping the shared gate 140 and the shared gate spacer 150, may have a larger width (refer to Wd) than that of the other portion (refer to Wp). FIG. 2 illustrates that the protrusion of the second active region 100B overlaps the shared gate 140 and the shared gate spacer 150. However, the present invention is not limited thereto, and the protrusion of the second active region 100B may not overlap a second high-concentration doped region 135B to be described below, while overlapping the shared gate 140. The other portion of the second active region 100B, excluding the protrusion, may have a constant width in the first direction. Furthermore, the first active region 100A may have a constant width (refer to Wu) in the first direction.

As shown in FIG. 3A, in a portion of the first active region 100A that overlaps the shared gate spacer 150, a first low-concentration doped region 130A may be formed. The first low-concentration doped region 130A may be doped with a dopant having a second conductive type different from the first well 110A, for example, a P-type dopant in a low concentration.

As shown in FIG. 3B, in portions of the first active region 100A that do not overlap the shared gate 140 and the shared gate spacer 150, a first high-concentration doped region 135A may be formed.

The first high-concentration doped region 135A may be doped with a dopant having the second conductive type, for example, a P-type dopant in a higher concentration than the first low-concentration doped region 130A.

In a portion of the first active region 100A that overlaps the shared gate 140, a channel region for each of the first and second pull-up transistors TU1 and TU2 may be defined. The channel region for each of the first and second pull-up transistors TU1 and TU2 may be doped with a first conductive-type dopant, for example, an N-type dopant in a low concentration. Lu and Wu represent the length and width of the channel region, respectively.

As shown in FIG. 3A, in portions of the second active region 100B that overlap the shared gate spacer 150 and the pass gate spacer 170, respectively, a second low-concentration doped region 130B may be formed. The second low-concentration doped region 130b may be doped with a dopant having the first conductive type different from the second well 110B, for example, an N-type dopant in a low concentration.

As shown in FIG. 3B in portions of the second active regions 100B that do not overlap the shared gate 140, the shared gate spacer 150, the pass gate 160, and the pass gate spacer 170, a second high-concentration doped region 135B may be formed. The second high-concentration doped region 135B may be doped with a first-conductive type dopant, for example, an N-type dopant in a higher concentration than the second low-concentration doped region 130B.

In a portion of the second active region 100B that overlaps the shared gate 140, a channel region for each of the first and second pull-down transistors TD1 and TD2 may be defined.

The channel region for each of the first and second pull-down transistors TD1 and TD2 may include a region doped with a second conductive-type dopant, for example, a P-type dopant in a low concentration, like the second well 110B, and the length and width of the channel region are represented by Ld and Wd.

Furthermore, in a portion of the second active region 100B that overlaps the pass gate 160, a channel region for each of the first and second transistors TP1 and TP2 may be defined. The channel region for each of the first and second pass transistors TP1 and TP2 may be doped with a second conductive-type dopant, for example, a P-type dopant in a low concentration, like the second well 110B, and the length and width of the channel region are represented by Lp and Wp.

The shape of the second active region 100B will be described in detail on the basis of the doped region. The channel region and the second low-concentration doped region 130B of the second active region 100B may protrude toward the adjacent first active region 100A, as compared to the second high-concentration doped region 135B. Thus, the channel region and the second low-concentration doped region 130B of the second active region 100B may have a larger width (refer to Wd) than that of the second high-concentration doped region 135B (refer to Wp). FIG. 2 illustrates that the channel region and the second low-concentration doped region 130B protrude toward the first active region 100A. However, the present invention is not limited thereto, and only the channel region or a part of the channel region and the second low-concentration doped region 130B may protrude more than the second high-concentration doped region 135B.

The first active region 100A, the shared gate 140 over the first active region 100A, and the first low-concentration doped region 130A and the first high-concentration doped region 135A, which are formed in the first active region 100A at both sides of the shared gate 140 and sequentially arranged from the shared gate 140, may form the first and second pull-up transistors TU1 and TU2, respectively.

Furthermore, the second active region 1006, the shared gate 140 over the second active region 100B, and the second low-concentration doped region 130B and the second high-concentration doped region 135B, which are formed in the second active region 100B at both sides of the shared gate 146 and sequentially arranged from the shared gate 140, may form the first and second pull-down transistors TD1 and TD2, respectively.

Furthermore, the second active region 100B, the pass gate 160 over the second active region 100B, and the second low-concentration doped region 130B and the second high-concentration doped region 135B, which are formed in the second active region 100B at both sides of the pass gate 160 and sequentially arranged from the pass gate 160, may form the first and second pass transistors TP1 and TP2, respectively.

The first and second active regions 100A and 100B, the shared gate 140, and the pass gate 160, which form the first pull-up transistor TU1, the first pull-down transistor TD1, and the first pass transistor TP1, and the first and second active regions 100A and 100B, the shared gate 140, and the pass gate 160, which form the second pull-up transistor TU2, and the second pull-down transistor TD2, and the second pass transistor TP2 may be arranged to be symmetrical with respect to the center point of the region where the SRAM cell is formed.

When the above-described SRAM cell is applied, the following effect may be obtained.

First, since the width Wd of the channel regions of the first and second pull-down transistors TD1 and TD2 is increased, a cell current ken and a cell ratio may be increased to improve the operating characteristic of the SRAM cell. The cell ratio refers to a current ratio of the first pass transistor TP1 to the first pull-down transistor TD1 or a current ratio of the second pass transistor TP2 to the second pull-down transistor TD2, and may be defined as the following formula: (Wd/Ld)/(Wp/Lp). Thus, when the width Wd is increased, the cell current and the cell ratio may be increased.

Furthermore, in order to increase the width Wd of the channel regions of the first and second pull-down transistors TD1 and TD2, the width of the second active region 100B may be increased. In particular, only the portion of the second active region 100B that overlaps the shared gate 140 and the shared gate spacer 150, may be formed to protrude toward the first active region 100A. Thus, the increase in size of the cell may be suppressed to reduce the chip area.

In the portion of the second active region 100B that overlaps the shared gate 140 and the shared gate spacer 150, the distance between the second active region 100B and the first active region 100A may be decreased. However, since the low-concentration doped regions, that is, the low-concentration channel region and the first low-concentration doped region 130A or the second low-concentration doped region 130B are disposed in the corresponding portion, the performance of the SRAM cell is unlikely to be degraded.

For example, although the distance between the first low-concentration doped region 130A and the second low-concentration doped region 130B on the same plane is physically smaller than the distance between the first high-concentration doped region 135A and the second high-concentration doped region 135B on the same plane, the actual distance between the first low-concentration doped region 130B and the second well 110B (refer to ① of FIG. 3A) is not smaller than the actual distance between the first high-concentration doped region 135A and the second well 110B (refer to ③ of FIG. 3B). This is because, since the first low-concentration doped region 130A is implanted at lower energy than the first high-concentration doped region 135A, the depth of a projected range (Rp) is low and a to depletion depth is also low. Similarly, the actual distance between the second low-concentration doped region 130B and the first well 110A (refer to ② of FIG. 3A) is not smaller than the actual distance between the second high-concentration doped region 135B and the first well 110B (refer to ④ of FIG. 3B). Thus, although the distance between the second active region 100B and the adjacent first active region 100A is reduced to maintain the size of the active region 100B while partially increasing the width of the second active region 100B, the distance reduction corresponds to distance reduction in the low-concentration doped region. Thus, it is possible to substantially prevent the degradation in performance of the SRAM cell caused by the distance reduction.

Since the width of the second active region 100B is not increased at a portion thereof which does not overlap the shared gate 140 and the shared gate spacer 150, the distance between the second active region 100B and the first active region 100A may be maintained at the corresponding portion. In other words, the distance between the first high-concentration doped region 135A and the second high-concentration doped region 135B may be constantly maintained.

Hereafter, referring to FIGS. 4A and 4B, a method for fabricating an SRAM cell in accordance with an exemplary embodiment of the present invention will be described. FIG. 4B is a cross-sectional view taken along line D-D' of FIG. 2, and FIG. 4A is a cross-sectional view illustrating an intermediate process for fabricating the device of FIG. 4B.

Figure 4A:
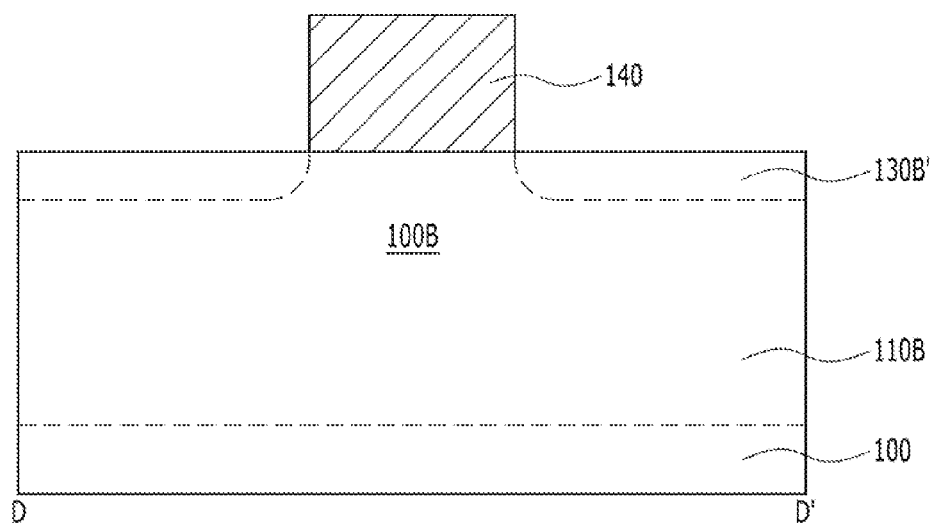
FIG. 4A is a cross-sectional view illustrating an intermediate process for fabricating the device of FIG. 4B.
Figure 4B:
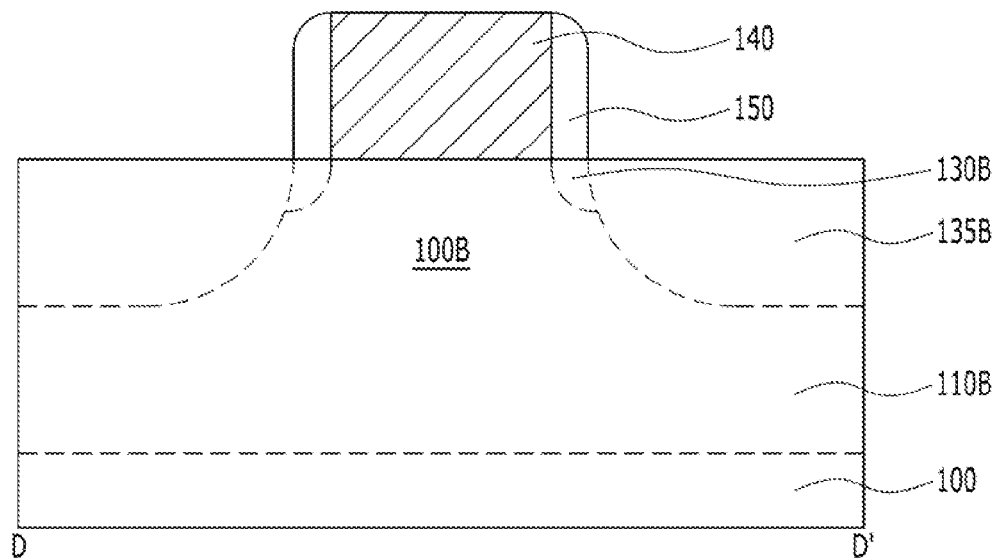
FIG. 4B is a cross-sectional view taken along line D-D' of FIG. 2.

Referring to FIG. 4A, a semiconductor substrate 100 is provided. The semiconductor substrate 100 may include a silicon substrate, a germanium substrate, or a silicon-germanium substrate.

A first well (refer to 110A of FIGS. 2 to 3C) and a second well 110B may be formed by selectively implanting a certain dopant into the semiconductor substrate 100.

An isolation region of the semiconductor substrate 100 may be selectively etched to form a trench, and an insulating material, such as an oxide or a nitride may be formed in the trench, thereby forming an isolation layer 120 to, define a first active region (refer to 100A of FIGS. 2 to 3C) and a second active region 100B.

A gate dielectric layer (not illustrated) may be formed over the semiconductor substrate 100, and a conductive layer may be formed over the gate dielectric layer and then patterned to form a shared gate 140 and a pass gate (refer to 160 of FIGS. 2 to 3C).

As a certain low-concentration dopant is selectively implanted into the first and second active regions 100A and 100B exposed by the shared gate 140 and the pass gate, an early first low-concentration doped region (not illustrated) may be formed in the first active region, and an early second low-concentration doped region 130B' may be formed in the second active region 100B.

Referring to FIG. 4B, an insulating material may be deposited along the entire surface of the resultant structure in which the shared gate 140 and the pass gate 160 are formed and a blanket etch process may be performed to form a shared gate spacer 150 on a sidewall of the shared gate 140 and to form a pass gate spacer (refer to 170 of FIGS. 2 to 3C) on a sidewall of the pass gate.

As a certain high-concentration dopant is selectively implanted into the first and second active regions 100A and 100B exposed by the shared gate 140, the shared gate spacer 150, the pass gate, and the pass gate spacer, a high-concentration doped region (refer to 135A of FIGS. 2 to 3C) may be formed in the first active region, and a second high-concentration doped region 135B may be formed in the second active region 100B. Then, the early first low-concentration doped region may become a first low-concentration doped region 130A limited to a region overlapping the pass gate spacer, and the early second low-concentration doped region 130B' may become a second low-concentration doped region 130B limited to a region overlapping the shared gate spacer 150.

Figure 5:
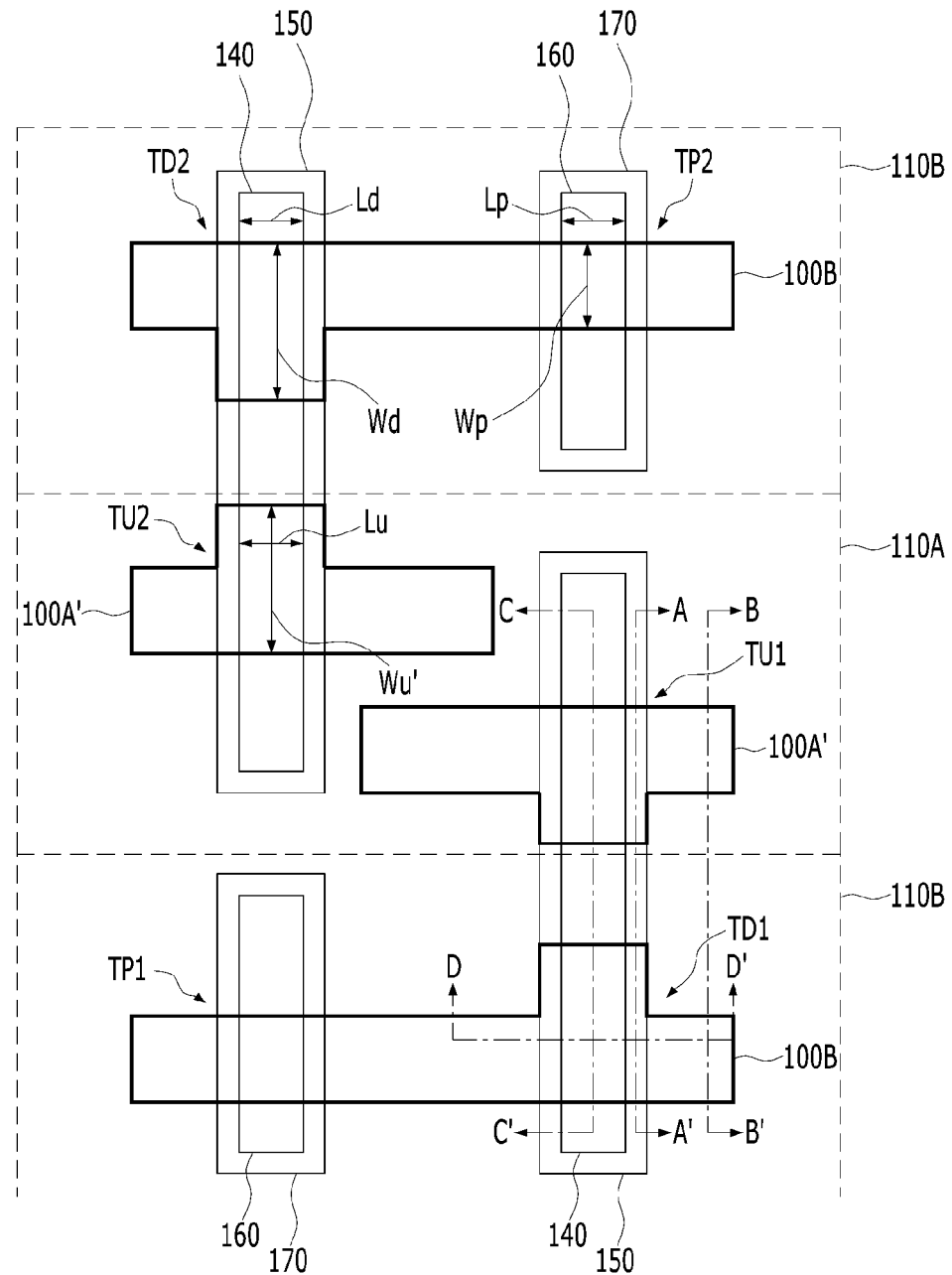
FIG. 5 is a plan view of an active region and a gate of the SRAM cell of FIG. 1.

In the above-described exemplary embodiments, the SRAM cell has been taken as an example for description, but the present invention is not limited thereto. The present invention may be applied to a case in which a channel width of at least one of an NMOS transistor and a PMOS transistor adjacent to each other must be increased in a structure including the NMOS transistor and the PMOS transistor. For example, a region of an NMOS active region, which overlaps a gate or the gate and a gate spacer, that is, a channel region (or the channel region and a low-concentration doped region) may be formed to protrude toward an adjacent PMOS active region (first case), a region of a PMOS active region, which overlaps a gate or the gate and a gate spacer, that is, a channel region (or the channel region and a low-concentration doped region) may be formed to protrude toward an adjacent NMOS active region (second case), or both of the first and second cases may be implemented at the same time as shown in FIG. 5. That is, in FIG. 5, a first channel region of a first active region 100A' protrudes toward the second active region 100B while a second channel region of the second active region 100B protrudes toward the first active region 100A'. The gate of the NMOS transistor and the gate of the PMOS transistor do not need to be connected to each other, unlike the SRAM cell. Thus, the gate of the NOMS transistor and the gate of the PMOS transistor may be positioned on a straight line extended in the first direction, and separated from each other. In this case, the degradation in performance caused by distance reduction may be substantially prevented without increasing the size of the device, as in the above-described embodiments.

In accordance with the embodiment of the present invention, it is possible to reduce the size while securing the performance.

Although various embodiments have been described for illustrative purposes, it will be apparent to those skilled in the art that various changes and modifications may be made without departing from the spirit and scope of the invention as defined in the following claims.

What is claimed:

1. A semiconductor device comprising:
   a first active region having a first conductive type and a second active region having a second conductive type, the first active region and the second active region being arranged in a first direction in a semiconductor substrate;
   a gate extending in the first direction and crossing the first active region and the second active region;
   a first channel region defined under the gate in the first active region and a second channel region defined under the gate in the second active region;
   a first low-concentration doped region, having the second conductive type, formed at both sides of the gate in the first active region and a first high-concentration doped region, having the second conductive type, formed at both sides of the first low-concentration doped region in the first active region; and
   a second low-concentration doped region, having the first conductive type, formed at both sides of the gate in the second active region and a second high-concentration doped region, having the first conductive type, formed at both sides of the second low-concentration doped region in the second active region, and
   wherein the second channel region protrudes toward the first active region in the first direction, compared to a whole of the second high-concentration doped region.

2. The semiconductor device of claim 1, wherein the second low-concentration doped region protrudes toward the first active region in the first direction, compared to a whole of the second high-concentration doped region.

3. The semiconductor device of claim 1, wherein a width, extending in the first direction, of the second channel region is greater than a width, extending in the first direction, of the second high-concentration doped region.

4. The semiconductor device of claim 2, wherein a width, extending in the first direction, of the second channel region and a width, extending in the first direction, of the second low-concentration doped region is greater than a width, extending in the first direction, of the second high-concentration doped region.

5. The semiconductor device of claim 1, wherein a distance, in the first direction, between the second channel region and the first channel region is smaller than a distance, in the first direction, between the second high-concentration doped region and the first high-concentration doped region.

6. The semiconductor device of claim 2, wherein a distance, in the first direction, between the second channel region and the first channel region and a distance, in the first direction, between the second low-concentration doped region and the first low-concentration doped region are smaller than a distance, in the first direction, between the second high-concentration doped region and the first high-concentration doped region.

7. The semiconductor device of claim 1, further comprising:
   a gate spacer formed on a sidewall of the gate,
   wherein the second low-concentration doped region overlaps the gate spacer.

8. The semiconductor device of claim 1, wherein the first conductive type comprises an N-type, and the second conductive type comprises a P-type.

9. The semiconductor device of claim 1, wherein the first channel region protrudes toward the second active region in the first direction, compared to the first high-concentration doped region.

10. The semiconductor device of claim 9, wherein the first low-concentration doped region protrudes toward the second active region in the first direction, compared to the first high-concentration doped region.

11. A semiconductor device comprising:
    a first active region having a first conductive type and a second active region having a second conductive type, the first active region and the second active region being arranged in a first direction in a semiconductor substrate;
    a gate extending in the first direction and crossing the first active region and the second active region; and
    a gate spacer formed on a sidewall of the gate,
    wherein a first portion of the second active region, which overlaps the gate, protrudes toward the first active region in the first direction, compared to a whole of a second portion of the second active region, the second portion does not overlap the gate and the gate spacer.

12. The semiconductor device of claim 11, wherein a third portion of the second active region, which overlaps the gate spacer, protrudes toward the first active region in the first direction, compared to a whole of the second portion.

13. The semiconductor device of claim 12, wherein the second portion comprises a dopant having a higher concentration than a dopant of the third portion and having a same conductive type as the dopant of the third portion.

14. The semiconductor device of claim 11, wherein a fourth portion of the first active region, which overlaps the gate, protrudes toward the second active region in the first direction, compared to a fifth portion of the first active region, which does not overlap the gate and the gate spacer.

15. The semiconductor device of claim 14, wherein a sixth portion of the first active region, which overlaps the gate spacer, protrudes toward the second active region in the first direction, compared to the fifth portion.

16. A semiconductor device comprising:
    an NMOS active region and a PMOS active region arranged in a first direction;
    a shared gate extending in the first direction and crossing the NMOS active region and the PMOS active region;
    a pass gate separated from the shared gate in a second direction, the pass gate extending in the first direction to cross the NMOS active region;
    a first NMOS channel region defined in the NMOS active region under the shared gate and a PMOS channel region defined in the PMOS active region under the shared gate;
    a second NMOS channel region defined under the pass gate in the NMOS active region;
    a first low-concentration N-type region and a first high-concentration N-type region defined in the NMOS active region at both sides of the shared gate and being sequentially arranged from the first NMOS channel region;

a second low-concentration N-type region and a second high-concentration N-type region defined in the NMOS active region at both sides of the pass gate and being sequentially arranged from the second NMOS channel region; and a low-concentration P-type region and a high-concentration P-type region defined in the PMOS active region at both sides of the shared gate and being sequentially arranged from the PMOS channel region, wherein the first NMOS channel region protrudes toward the PMOS active region in the first direction, compared to a whole of the first high-concentration N-type region.

17. The semiconductor device of claim 16, wherein the first low-concentration N-type region protrudes toward the PMOS active region in the first direction, compared to a whole of the first high-concentration N-type region.

18. The semiconductor device of claim 16, further comprising:

a shared gate spacer formed on the sidewall of the shared gate and a pass gate spacer formed on the sidewall of the pass gate, wherein the first low-concentration N-type region and the low-concentration P-type region overlap the shared gate spacer, and the second low-concentration N-type region overlaps the pass gate spacer.

* * * * *